Figure 1:
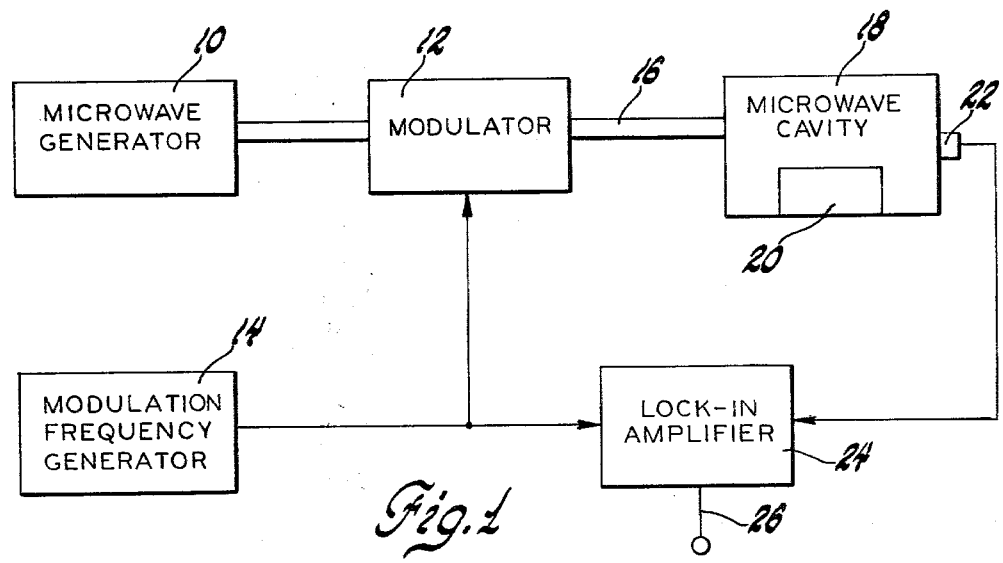

United States Patent [19]

Faxvog et al.

[11] 4,277,741
[45] Jul. 7, 1981

[54] MICROWAVE ACOUSTIC SPECTROMETER

[75] Inventors: Frederick R. Faxvog, Rochester; Mark K. Krage, Royal Oak, both of Mich.

[73] Assignee: General Motors Corporation, Detroit, Mich.

[21] Appl. No.: 51,623

[22] Filed: Jun. 25, 1979

[51] Int. Cl.³ ............................................. G01R 27/04
[52] U.S. Cl. .................................................. 324/58.5 C
[58] Field of Search ..................... 324/58.5 C, 58.5 R, 324/95, 58 C, 58.5 A, 58.5 B

[56] References Cited

U.S. PATENT DOCUMENTS 2,792,548   5/1957   Hershberger ................... 324/58.5 C
3,820,901   6/1974   Kreuzer ............................. 356/425

Primary Examiner—Ernest F. Karlsen
Attorney, Agent, or Firm—Warren D. Hill

[57] ABSTRACT

Magnetic and dielectric properties of a sample are determined by measuring the microwave absorption of the sample. A cavity containing the sample material is coupled to a microwave source and the radiation propagated to the cavity is modulated at a reference frequency. A microphone coupled to the cavity senses the pressure fluctuations resulting from the thermal changes generated in the sample by the absorption of the modulated microwaves and the microphone signal is analyzed at the reference frequency to provide an electrical output which is a measure of the microwave absorption by the sample material. Both dielectric and magnetic properties of the sample can be measured.

3 Claims, 2 Drawing Figures

MICROWAVE ACOUSTIC SPECTROMETER

This invention relates to a microwave acoustic spectrometer for measuring microwave absorption parameters of a sample material.

It is often desired to measure dielectric properties and/or magnetic properties of a material particularly as those properties relate to the microwave absorption parameters of the material. Such a spectrometer is useful to microwave heating or processing applications. For example, the microwave curing requirements of rubber can vary from batch to batch and from one type of rubber to another. If the microwave absorption coefficient of a given rubber batch were accurately known, the microwave oven energy setting or the length of heating could be accurately adjusted or the composition of the rubber could be modified accordingly.

It is therefore an object of this invention to provide a spectrometer for measuring the microwave absorption parameters of various sample materials. It is a further object to provide such equipment which requires only small samples and requires low power microwave equipment.

The invention is carried out by providing a microwave generator, a microwave modulator which may be a part of the microwave generator, a microwave cavity for containing the test sample and means for propagating the modulated radiation to the cavity, a microphone coupled to the cavity to sense pressure fluctuations in the cavity and an electrical circuit for analyzing the microphone signal to provide a measure of the microwave absorption by the sample material.

Figure 2:
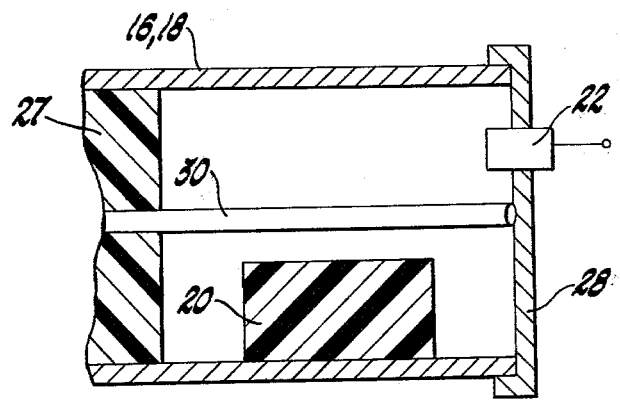

The above and other advantages will be made more apparent from the following specification taken in conjunction with the accompanying drawings wherein like reference numerals refer to like parts and wherein:

FIG. 1 is a block diagram of microwave acoustic spectrometer apparatus according to the invention, and FIG. 2 is a cross-sectional view of a microwave cavity of FIG. 1.

The FIG. 1 diagram presents the apparatus in the form of a system wherein the microwave generator 10 such as a klystron produces a beam of microwave radiation which is coupled to a modulator 12 which modulates that radiation at a frequency preferably in the audio frequency range. A modulation frequency generator 14 connected to the modulator 12 determines the modulation frequency. In practice commercial units are available having the modulator function as a part of the microwave generator and the modulation frequency generation as well may be part of the same unit or may be a separate unit connected to the microwave source unit. Thus, the modulation may be accomplished by control of the radiation emission from the generator 10. The modulated radiation is coupled as by a wave guide or coaxial cable 16 to a microwave cavity 18. The sample 20 upon which measurements are being made is placed in the microwave cavity. A microphone 22 is coupled to the microwave cavity to sense any pressure fluctuations therein. The output of the microphone 22 is fed to one input of a lock-in amplifier 24 which has a second input connected to the modulation frequency generator 14. The amplifier output is produced on terminal 26 and has a value representing the property being measured.

In operation, the modulated radiation coupled to the microwave cavity periodically heats the sample material at the frequency of modulation and the sample material, in turn, heats the surrounding air or other gas at the same frequency to cause pressure fluctuations in the gas which are detectable by the microphone 22. The lock-in amplifier measures the amplitude of the microphone signal at the modulation frequency. The measured signal amplitude is directly proportional to absorbed microwave power. The lock-in amplifier multiplies the microphone signal and the reference signal and time averages the product. All the signal frequencies not the same as the reference frequency cancel out. The amplifier output signal contains only that microphone signal which is synchronous with the reference signal. The detection scheme is very sensitive so that only small samples and low power microwave equipment are necessary.

FIG. 2 illustrates a specific example of a microwave cavity 18 which is simply formed in the end of the coaxial cable 16 by removing some of the dielectric material 27 from between the conductors and placing an end cap 28 over the end of the coaxial line to define an airtight cavity between the conductors. The microphone 22 is mounted in the end cap 28. The sample 20 is a small block of material inserted in the cavity or it could, for example, be a toroidal mass which fits around the inner conductor 30. Since microwave radiation comprises electric and magnetic wave components, measurements can be made of the dielectric loss factor or of the magnetic loss factor. If a metal end cap is used, the coaxial conductors 30 are shorted and the magnetic field will predominate in the region of the sample. Then the output signal of the lock-in amplifier will represent the magnetic loss factor of the material. This technique is useful for making measurements of magnetic materials such as ferrites. If, on the other hand, a dielectric end cap 28 is used, the termination of the coaxial line is open and the predominant microwave field in the region of the sample 20 is an electric field. In that case, the dielectric loss factor is the measured parameter.

In practice, the apparatus has been operated using a microwave generator 10 comprising a Model HP 8614A manufactured by Hewlett Packard Corporation, of Palo Alto, California, having an output frequency adjustable to the range of 820 MHz to 2550 MHz. The equipment was operated at 915 MHz and 2450 MHz which are the common frequencies used for heating. The microwave generator was modulated at a frequency of 100 Hz applied by an external frequency generator 14. A 0.141 inch semirigid coaxial line 16 terminating in the cavity 18 was used with both metal and dielectric end caps for making test measurements on sample materials. The microphone 22 was an electret microphone Model BT-1759 manufactured by Knowles Electronic, Inc. of Franklin Park, Illinois. The lock-in amplifier was Model 124A manufactured by Princeton Applied Research Corporation, Princeton, New Jersey. Although such measurements can be made at a modulation frequency in the audio range, particularly up to about 10,000 Hz, the lower portion of that range is most often used. As described above, the amplitude of the microphone output is used as the output signal. However, the phase change in the output signal due to the sample material is also a useful parameter which can be measured to determine the microwave absorption and thermal properties of material.

It will thus be seen that the spectrometer apparatus according to this invention provides a way of very quickly determining the microwave absorption characteristics of small samples and requires only components which are readily available commercially. Moreover the apparatus is easily operated by a technician and provides output signals which are linear with respect to microwave power absorbed by the sample.

The embodiments of the invention in which an exclusive property or privilege is claimed are defined as follows:

1. A microwave-acoustic spectrometer for measuring a microwave absorption parameter of a non-gaseous sample material comprising, a sealed microwave cavity containing the sample material and a gas, a source of microwave radiation, means for modulating the radiation at a reference frequency, means for propagating the radiation into the microwave cavity to thereby allow microwave absorption by the sample material, whereby the sample material and the gas in the cavity is periodically heated to produce pressure fluctuations at the reference frequency, a microphone coupled to the cavity and responsive to the pressure fluctuations therein to produce a signal at the reference frequency having a parameter correlated to the absorption parameter, and means for analyzing the microphone signal at the reference frequency to provide an output which is a measure of microwave absorption by the sample material.

2. A microwave-acoustic spectrometer for measuring a microwave absorption parameter of a non-gaseous sample material comprising, a sealed microwave cavity containing the sample material and a gas, a source of microwave radiation, means for modulating the radiation at a reference frequency, means for propagating the radiation into the microwave cavity to thereby allow microwave absorption by the sample material, whereby the sample material and the gas in the cavity is periodically heated to produce pressure fluctuations at the reference frequency, a microphone coupled to the cavity and responsive to the pressure fluctuations therein to produce a signal at the reference frequency having an amplitude correlated to the absorption parameter, and a circuit for detecting the microphone signal amplitude at the reference frequency to provide an output which is a linear measure of microwave absorption by the sample material.

3. A microwave-acoustic spectrometer for measuring microwave absorption parameter of a non-gaseous sample material comprising, a source of microwave radiation, means for modulating the radiation at a reference frequency, a coaxial line coupled at one end to the radiation source, a cap on the other end of the line defining with the line a microwave cavity for containing sample material to thereby allow microwave absorption by the sample material, whereby the sample material and the gas in the cavity is periodically heated to produce pressure fluctuations at the reference frequency, a microphone coupled to the cavity and responsive to the pressure fluctuations therein to produce a signal at the reference frequency having an amplitude correlated to the absorption parameter, and a lock-in amplifier for detecting the amplitude of the microphone signal at the reference frequency to provide an output which is a linear measure of microwave absorption by the sample material.

* * * * *